(12) United States Patent  
Cartier et al.

(10) Patent No.: US 7,871,869 B2
(45) Date of Patent: Jan. 18, 2011

(54) EXTREMELY-THIN SILICON-ON-INSULATOR TRANSISTOR WITH RAISED SOURCE/DRAIN

(75) Inventors: Eduard A. Cartier, New York, NY (US); Steven J. Koester, Ossining, NY (US); Kingsuk Maitra, Yorktown Heights, NY (US); Amlan Majumdar, White Plains, NY (US); Renee T. Mo, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/543,679

(22) Filed: Aug. 19, 2009

(65) Prior Publication Data

US 2009/0311836 A1 Dec. 17, 2009

Related U.S. Application Data

(62) Division of application No. 11/837,057, filed on Aug. 10, 2007, now Pat. No. 7,652,332.

(51) Int. Cl.
*H01L 21/00* (2006.01)
(52) U.S. Cl. .................. 438/151; 438/163
(58) Field of Classification Search .......... 438/151, 438/163, 300
See application file for complete search history.

(56) References Cited

U.S. PATENT DOCUMENTS

| | | | |
|---|---|---|---|
| 5,116,771 A | 5/1992 | Karulkar | |
| 6,614,079 B2 | 9/2003 | Lee et al. | |
| 6,653,700 B2 * | 11/2003 | Chau et al. | 257/412 |
| 6,908,850 B2 | 6/2005 | Doris et al. | |
| 7,067,434 B2 | 6/2006 | Colombo et al. | |
| 7,078,298 B2 | 7/2006 | Lee et al. | |
| 7,202,123 B1 | 4/2007 | Pan | |
| 7,271,446 B2 * | 9/2007 | Dokumaci et al. | 257/348 |
| 7,652,332 B2 * | 1/2010 | Cartier et al. | 257/347 |
| 2003/0042568 A1 | 3/2003 | Jang | |
| 2005/0167741 A1 | 8/2005 | Divakaruni et al. | |

* cited by examiner

*Primary Examiner*—Mark Prenty
(74) *Attorney, Agent, or Firm*—Stephen Bongini; Fleit Gibbons Gutman Bongini & Bianco PL

(57) ABSTRACT

An extremely-thin silicon-on-insulator transistor is provided that includes a buried oxide layer above a substrate, a silicon layer above the buried oxide layer, a gate stack on the silicon layer, a nitride liner on the silicon layer and adjacent to the gate stack, an oxide liner on and adjacent to the nitride liner, and raised source/drain regions. The gate stack includes a high-k oxide layer on the silicon layer and a metal gate on the high-k oxide layer. Each of the raised source/drain regions has a first part comprising a portion of the silicon layer, a second part adjacent to parts of the oxide liner and the nitride liner, and a third part above the second part. Also provided is a method for fabricating an extremely-thin silicon-on-insulator transistor.

7 Claims, 5 Drawing Sheets

EXTREMELY-THIN SILICON-ON-INSULATOR TRANSISTOR WITH RAISED SOURCE/DRAIN

CROSS-REFERENCE TO RELATED APPLICATIONS

This is a divisional of application Ser. No. 11/837,057, filed Aug. 10, 2007, now U.S. Pat. No. 7,652,332. The entire disclosure of prior application Ser. No. 11/837,057 is herein incorporated by reference.

FIELD OF THE INVENTION

The present invention generally relates to the field of semiconductors, and more particularly relates to extremely-thin silicon-on-insulator field-effect transistors with a raised source/drain structure and a method for fabricating the same.

BACKGROUND OF THE INVENTION

Complementary Metal Oxide Semiconductor ("CMOS") Field Effect Transistors ("FETs") are employed in almost every electronic circuit application, such as signal processing, computing, and wireless communications. One known type of FET is a Silicon-On-Insulator ("SOI") FET. An SOI transistor with a very thin SOI body thickness and optional light halo doping has very good short channel control. More information of such SOI transistors is available in the references B. Doris et al., "Extreme scaling with ultra-thin Si channel MOSFETs" (IEDM Technical Digest, 2002); B. Doris et al., "Device design considerations for ultra-thin SOI MOSFETs" (IEDM Technical Digest, 2003); and D. V. Singh et al., "Stress memorization in high-performance FDSOI devices with ultra-thin silicon channels and 25 nm gate lengths" (IEDM Technical Digest, 2005), all of which are herein incorporated by reference.

While thin SOI transistors allow very good short channel control, an undoped or lightly-doped Extremely Thin Silicon-On-Insulator ("ETSOI") transistor with a conventional heavily-doped polysilicon gate has a very low threshold voltage ($V_T$), which leads to a very high transistor off current ($I_{OFF}$). An alternative is to use a high-K dielectric and metal gate stack. The resulting ETSOI transistor has a targeted threshold voltage ($V_T$), which leads to a lower transistor off current ($I_{OFF}$) than the conventional heavily-doped polysilicon gate transistor due to improved sub-threshold slope ($SS_{SAT}$). The high-K dielectric and metal gate stack also increases the gate capacitance ($C_G$), which leads to a higher transistor on current ($I_{DSAT}$). However, an ETSOI transistor with a high-K dielectric and gate stack without proper spacers suffers from the growth of an underlayer of oxide that lowers the gate capacitance. Furthermore, any thin-body SOI transistor like an ETSOI transistor needs an epitaxial raised source/drain to obtain a low transistor series resistance. However, the formation of a raised source/drain also requires the use of spacers for selective epitaxial growth, which leads to silicon loss during reactive-ion etching ("RIE") of the spacer.

FIG. 10 shows a known FET with a high-K dielectric, metal gate, and oxide-nitride-oxide spacers. As shown, this transistor has a high-K gate dielectric 2310, a gate electrode 2312 that is polysilicon, poly-SiGe, or metal, an oxide liner 2328, a nitride liner 2330, and oxide sidewall spacers 2334 and 2336 that are formed by oxide RIE that stops on the nitride liner 2330. The oxide liner 2328 that is in contact with the high-K gate dielectric 2310 leads to the growth of an underlayer of oxide beneath the high-K oxide. This underlayer of oxide (or "underoxide") lowers the gate capacitance, which is not desirable.

Another known FET structure has a raised source/drain, high-K dielectric, metal gate, and oxide-nitride spacers. This transistor has an L-shaped oxide spacer, a nitride spacer, and a high-K gate oxide. The oxide spacer is in contact with the high-K gate oxide, which leads to underoxide growth. This lowers the gate capacitance, which is not desirable.

Yet another known FET structure has L-shaped nitride spacers and a raised source/drain. For this FET structure, photolithography and a hot phosphoric acid wet etch are used to form the L-shaped nitride spacers, and subsequent epitaxial growth is used to form the raised source/drain. However, this process is not self-aligned. This causes the L-shaped nitride spacers to be asymmetric, with about 10 nm of asymmetry because of overlay errors that cannot be controlled to better than 10 nm with current processes. With this process, if nitride RIE was instead used to form symmetric, self-aligned sidewall spacers, the nitride RIE would not stop on the underlying silicon. Thus, the result would be silicon loss, which leads to a high series resistance and a low on current. Such silicon loss cannot occur in the fabrication of an ETSOI transistor because of the extreme thinness of the silicon layer.

SUMMARY OF THE INVENTION

Briefly, in accordance with the present invention, disclosed are a method, transistor, and integrated circuit. According to one embodiment, there is provided an ETSOI transistor that includes a buried oxide layer above a substrate, a silicon layer above the buried oxide layer, a gate stack on the silicon layer, a nitride liner having a first part on the silicon layer and a second part adjacent to the gate stack, an oxide liner having a first part on the first part of the nitride liner and a second part adjacent to the second part of the nitride liner, and raised source/drain regions. The gate stack includes a high-k oxide layer on the silicon layer and a metal gate on the high-k oxide layer. Each of the raised source/drain regions has a first part comprising a portion of the silicon layer, a second part adjacent to the first part of the oxide liner and the first part of the nitride liner, and a third part above the second part and extending higher than a top of the first part of the nitride liner.

Another embodiment of the present invention provides a method for fabricating an ETSOI transistor. According to the method, a gate stack is formed on a silicon layer that is above a buried oxide layer. The gate stack includes a high-k oxide layer on the silicon layer and a metal gate on the high-k oxide layer. A first nitride layer is formed on the silicon layer and the gate stack and an oxide layer is formed on the first nitride layer. A second nitride layer is formed on the oxide layer. The first nitride layer and the oxide layer are etched so as to form a nitride liner and an oxide liner adjacent to the gate stack. The second nitride layer is etched so as to form a first nitride spacer adjacent to the oxide liner. A raised source/drain region is epitaxially formed adjacent to the nitride liner, the oxide liner, and first nitride spacer. Ions are implanted into the raised source/drain region using the first nitride spacer to align the implantation.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION

Embodiments of the present invention provide extremely-thin silicon-on-insulator ("ETSOI") field-effect transistors with a thin spacer structure of nitride and oxide layers. This spacer structure enables the transistors to be formed with a high-K dielectric and metal gate stack and a raised source/drain, without underoxide growth beneath the high-K dielectric and without silicon loss during spacer formation.

FIGS. 1 to 9 illustrate a process for forming an extremely-thin silicon-on-insulator transistor according to an embodiment of the present invention. The process begins with an SOI wafer that is formed by a silicon substrate 102, a buried oxide layer ("BOX") 104, and an ETSOI layer 106. In this embodiment, the SOI wafer is a "thin" SOI wafer having a thickness in the 15-30 nm range. Alternatively, the process can begin with a "thick" SOI wafer having a thickness in the 30-90 nm range, and thinning can be performed using oxidation and a hydrofluoric acid (HF) wet etch to reduce the thickness (e.g., down to the 15-30 nm range).

An active area for the transistor is then defined. In this embodiment, the active area is defined through pad-film deposition, photolithography, and reactive-ion etching ("RIE"). In particular, a pad oxide 212 (e.g., having a thickness of 2-10 nm) is formed in a conventional oxidation furnace, and a pad nitride 214 (e.g., having a thickness of 30-150 nm) is deposited using low-pressure chemical vapor deposition ("LPCVD") or rapid-thermal chemical vapor deposition ("RTCVD"). Photolithography and a nitride-oxide-silicon RIE are then performed to define the active area.

Figure 1:
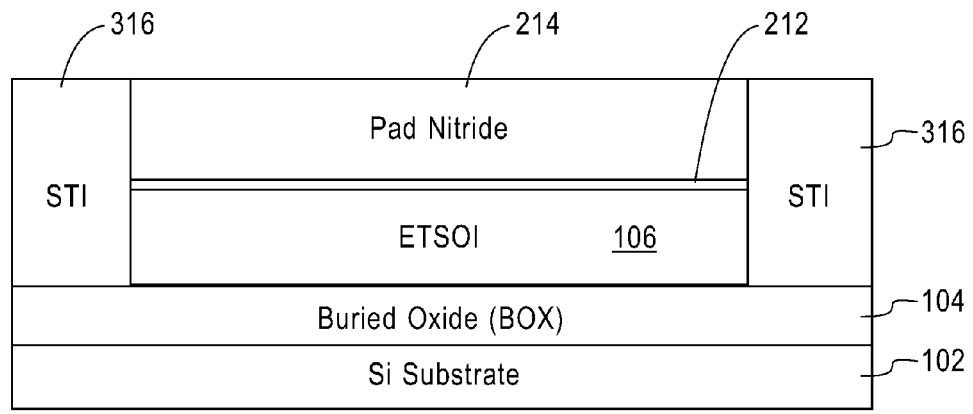
FIGS. 1 to 9 are cross-sectional views of a process for forming an extremely-thin silicon-on-insulator transistor according to an embodiment of the present invention.

Next, the active area is isolated, such as through shallow trench isolation ("STI"). In this embodiment, STI is obtained through deposition of an STI oxide, densification anneals, and chemical-mechanical polishing ("CMP") that stops on the pad nitride 214. This forms an STI region 316 over the BOX layer 104 that is continuous around the active area, as shown in FIG. 1.

The pad nitride 214, along with any STI oxide remaining on the pad nitride, and the pad oxide 212 are then removed (e.g., through wet etching using hot phosphoric acid and HF). A sacrificial oxide layer is then formed through oxidation to create a screening layer for the subsequent well implants. In this embodiment, the well implants are then done using photolithography to selectively define NFET and PFET areas for the wells, and then ions are implanted to form the wells 520. A well for an NFET is formed by implanting p-type species (such as B, $BF_2$, or In), while a well for a PFET is formed by implanting n-type species (such as As, P, or Sb). An anneal is performed after well implantation to heal the damage to the thin SOI layer due to ion implantation. Alternatively, well implantation is skipped to create a completely undoped device. The sacrificial oxide layer is then removed (e.g., using HF).

Most semiconductor integrated circuits include input/output (I/O) transistors that need a thick gate oxide to allow operation operate at higher voltages. However, high-speed transistors in the same integrated circuit are formed with thin gate oxide layers. To provide both types of transistors in the same integrated circuit, a thick gate oxide layer is first formed through deposition over the entire wafer. Then, the thick-oxide transistors are masked off using photolithography, and the thick gate oxide layer is removed (e.g., using an HF etch) from areas for the thin gate oxide transistors.

Figure 2:
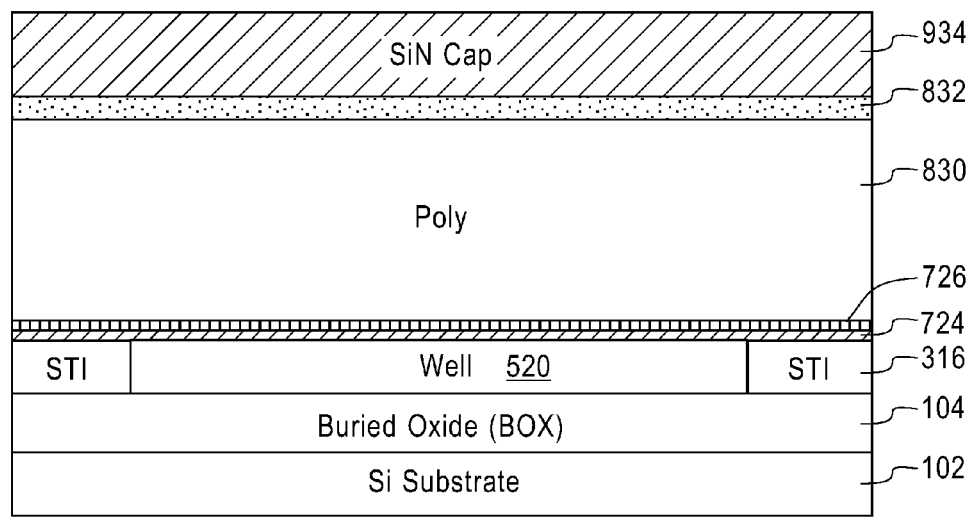

A high-K oxide layer 724 and a metal gate layer 726 are then deposited, as shown in FIG. 2. In this embodiment, the high-K oxide layer 724 is deposited using metal-organic chemical vapor deposition ("MOCVD") or atomic-layer deposition ("ALD"). A metal gate layer 726 is then deposited on the high-K oxide layer 724, such as by using physical vapor deposition ("PVD"), MOCVD, or ALD. Next, a gate polysilicon cap 830 is deposited on the metal gate layer 726, such as through LPCVD or silicon sputtering. A poly screen oxide layer 832 is then deposited onto the polysilicon cap 830 as a screen for subsequent gate implants, and also to protect the doped polysilicon from coming into contact with the etchant used during disposable spacer removal. In this embodiment, the poly screen oxide 832 is deposited using RTCVD or plasma-enhanced chemical vapor deposition ("PECVD").

The polysilicon cap 830 is then doped to lower gate line resistance, which is desired for high-speed switching of the transistor. In this embodiment, doping is performed selectively through the use of photolithography, with NFETs receiving n-type ion implants and PFETs receiving p-type ion implants.

Next, a silicon nitride cap 934 is deposited to allow the later formation of a silicon (or SiGe) raised source/drain through epitaxy. In particular, the nitride cap 934 protects the polysilicon gate during epitaxy to avoid forming a polysilicon (or poly-SiGe) mushroom on the gate line, which would adversely affect transistor performance as well as transistor yield. (In some embodiments, an oxide cap is next deposited to act as a hardmask for gate etch.)

Figure 3:
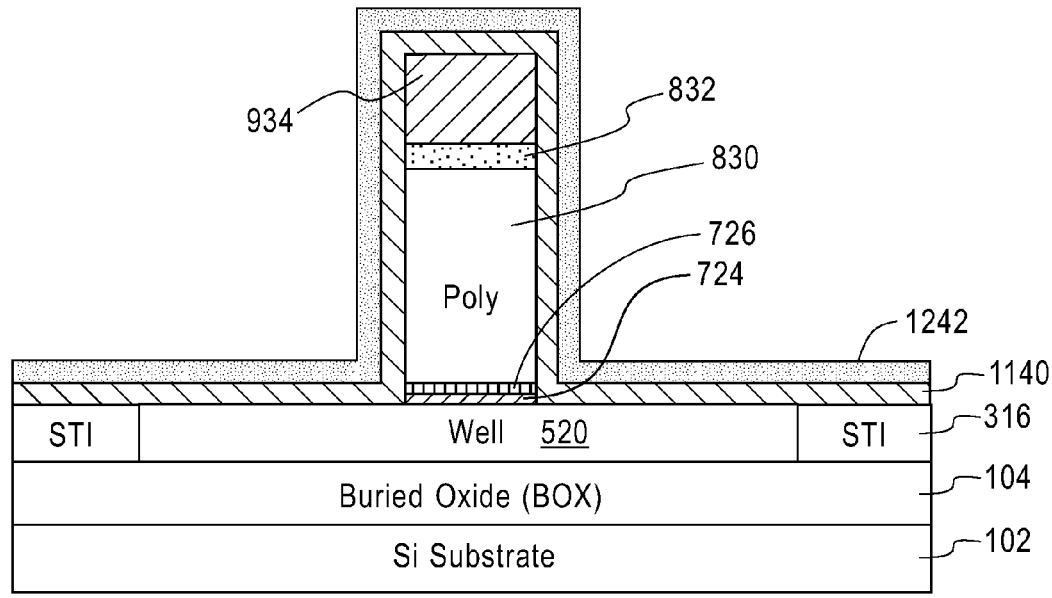

The transistor gate is then defined using photolithography, RIE, and wet cleaning. The wet cleaning removes any polymers formed during the RIE and the oxide cap if previously formed on top of the nitride cap 934. As shown in FIG. 3, the resulting gate stack is formed by the high-k dielectric layer 724, the metal gate layer 726, the polysilicon cap layer 830, the poly screen oxide layer 832, and the silicon nitride cap layer 934.

A thin nitride liner 1140 (e.g., with a 2-5 nm thickness) is then deposited to cap the gate stack. This nitride liner acts as a diffusion barrier to oxygen and prevents the formation of an underlayer of silicon oxide (or "underoxide") beneath the high-K oxide layer, which would lower the gate capacitance and the transistor drive current. A thin oxide liner 1242 (e.g., with a 2-5 nm thickness) is then deposited atop the nitride liner 1140. This oxide liner acts as the etch stop layer for the later nitride RIE during disposable spacer formation, and prevents this RIE from consuming the underlying silicon, which would lead to a very high transistor series resistance and lower the transistor drive current.

Figure 4:
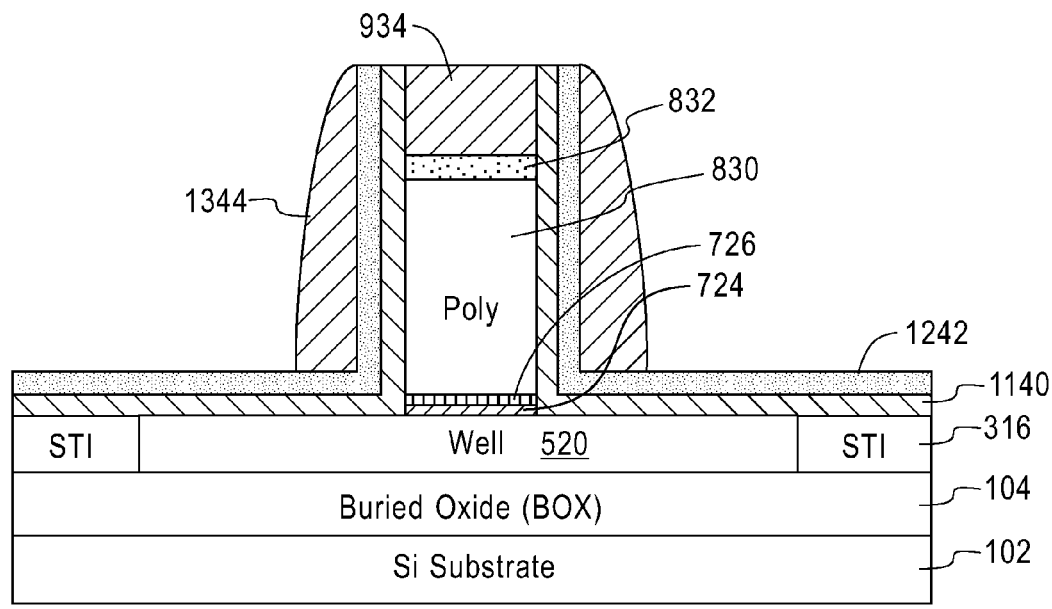

Next, a disposable nitride spacer 1344 (e.g., with a 5-50 nm thickness) is formed on all of the transistors, as shown in FIG. 4. The disposable nitride spacer 1344 is formed through nitride deposition (e.g., using RTCVD or PECVD) and then an RIE that stops on the underlying oxide liner and thus does not consume any of the underlying silicon.

Figure 5:
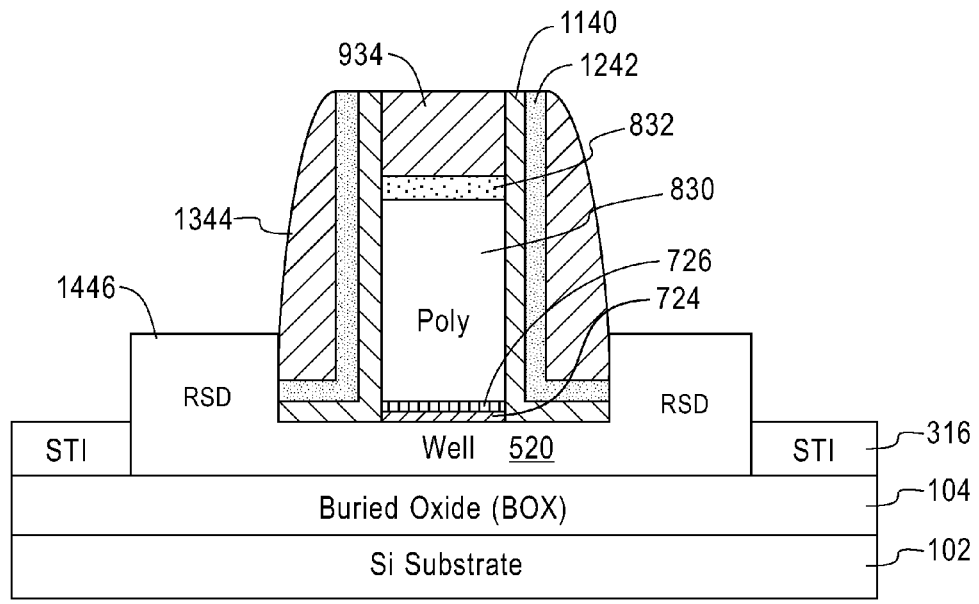

A raised source/drain 1446 is then formed using epitaxy, as shown in FIG. 5. This thickens the silicon area where deep source/drain implantation is to be performed, in order to reduce the transistor series resistance and increase the transistor on current. To form the raised source/drain 1446, an initial pre-cleaning removes the oxide and liners and expose the silicon surface in the source/drain areas. In this embodiment, the pre-cleaning is performed using an HF wet etch or HF-vapor based chemical oxide removal ("COR"). This produces, on each side of the gate stack, a spacer structure formed by an L-shaped nitride layer 1140, an L-shaped oxide layer 1242, and a nitride layer 1344 above the horizontal portion of the oxide layer 1242.

Next, epitaxy that is selective with respect to oxide and nitride is used to form the raised source/drain 1446, so there is no deposition on the nitride cap 934, the nitride-oxide-nitride spacers 1140-1242-1344, and the STI oxide 316. In this embodiment, the raised source/drain 1446 is formed of silicon (or SiGe or SiC or SiGeC).

Figure 6:
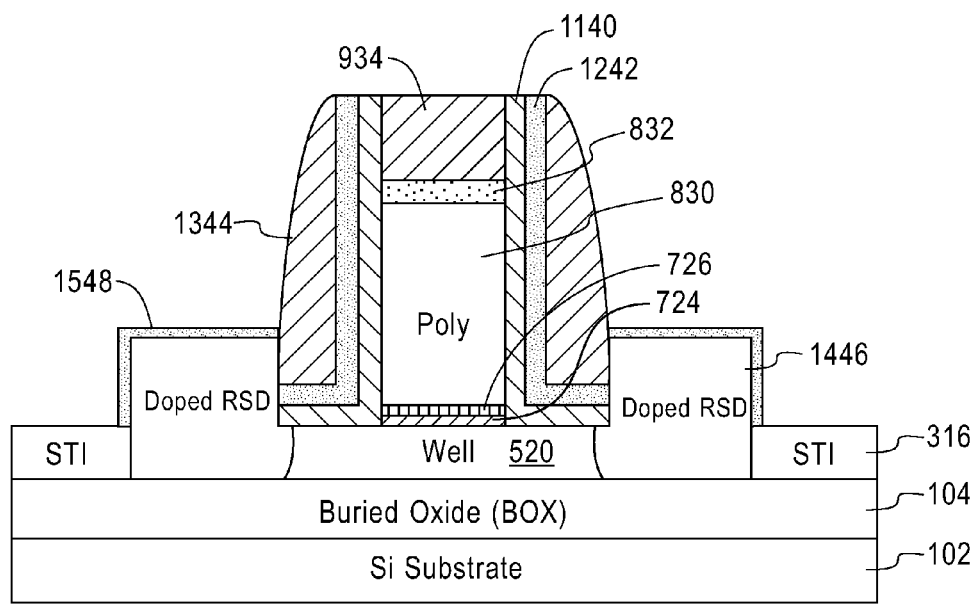

The raised source/drain 1446 is then oxidized to create a thin RSD oxide layer 1548, as shown in FIG. 6. This RSD oxide layer 1548 acts as a screening layer for the deep source/drain implantation, and protects the doped raised source/drain from coming into contact with the etchant used during disposable spacer removal. In this embodiment, the RSD oxide layer 1548 is created in an oxidation furnace at low temperature to avoid any possibility of underoxide growth. While the oxidation rate at low temperature is generally low, it can be enhanced using a high pressure or a plasma process. Next, deep source/drain implantation is performed using the disposable spacer 1344 to align the implantation. In this embodiment, the deep implantation is done by using photolithography to selectively define NFET and PFET areas for deep source/drain implants, and then ions are implanted. N-type species are implanted for NFETs, while p-type species are implanted for PFETs. A thermal anneal is then performed to activate and diffuse the ions implanted into the polysilicon cap 830 and the raised source/drain 1446, such as through a spike rapid-thermal anneal (RTA).

The disposable spacer 1344 and nitride cap 934 are then removed (e.g., through a hot phosphoric acid etch). The doped polysilicon gate line 830 is encapsulated by the poly screen oxide 934 and the oxide liner 1242, and the doped raised source/drain 1446 is capped by the RSD oxide layer 1548. Therefore, these doped regions do not come into contact with the etchant (e.g., hot phosphoric acid) and are not etched away.

Figure 7:
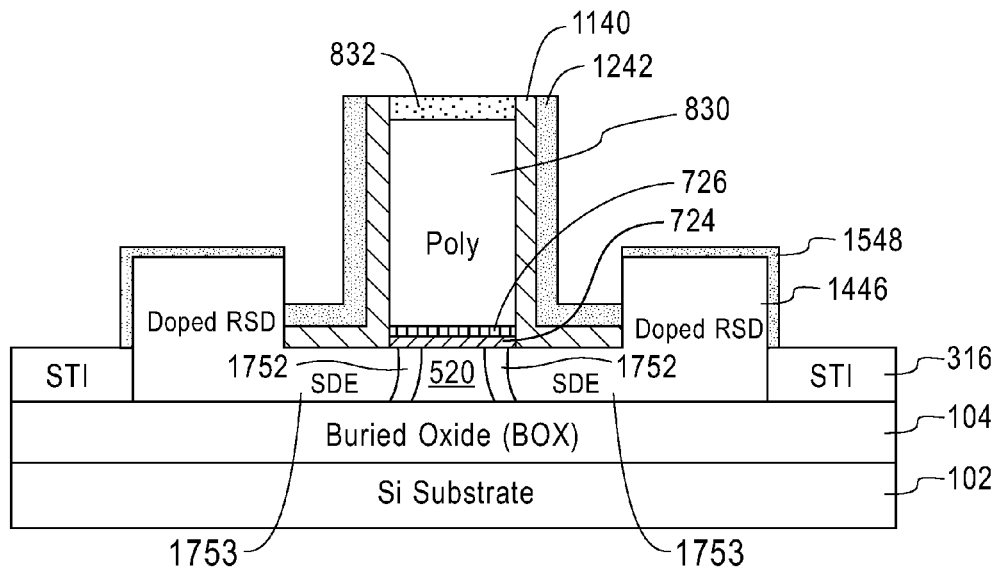

Halo 1752 and source/drain extensions 1753 are then formed in this embodiment through implantation, as shown in FIG. 7. Photolithography is used to selectively define the NFET and PFET areas for source/drain extension and halo implants, and then ions are implanted. For an NFET, the halo implants are performed with a p-type species and the extension implants are performed with an n-type species. For a PFET, the halo implants are performed using an n-type species, and the extension implants are performed using p-type species. Alternatively, the halo implants are skipped when making a completely undoped-body device.

Figure 8:
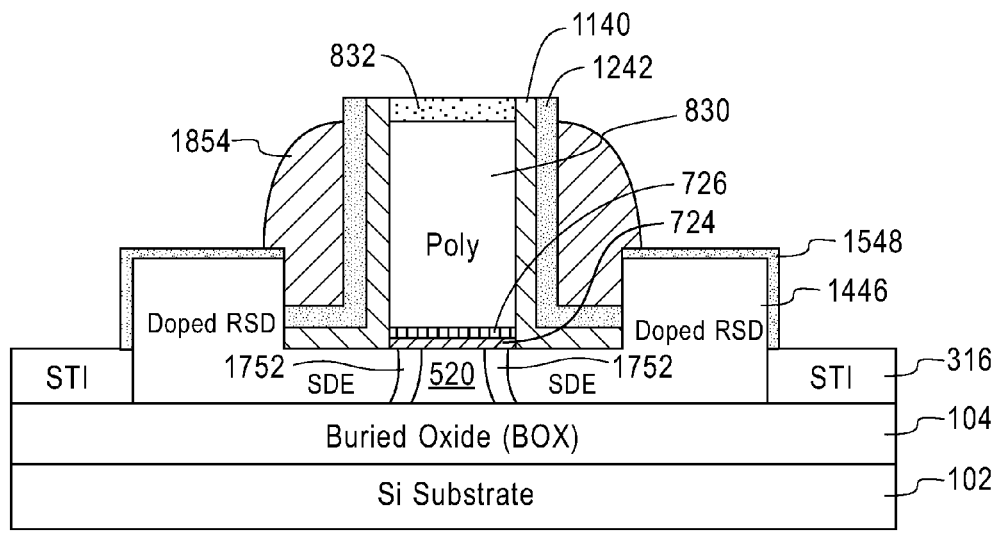

Next, there is formed a final spacer 1854 for self-aligned silicide formation, as shown in FIG. 8. In this embodiment, this is achieved by depositing an oxide liner and a nitride spacer, such as by using RTCVD or PECVD. An RIE of the nitride is performed, which stops on the oxide liner so as to avoid unwanted loss of material from the raised source/drain 1446. Thus, on each side of the gate stack there is a spacer structure formed by the L-shaped nitride layer 1140, the L-shaped oxide layer 1242, and the final spacer 1854. Then, the wafers are subjected to annealing (e.g., millisecond laser anneal or flash anneal) to activate the halo and extension implants without diffusing them into the buried oxide layer 104. Diffusion of the halo or extension implants would degrade performance due to dose loss into the underlying buried oxide layer.

Figure 9:
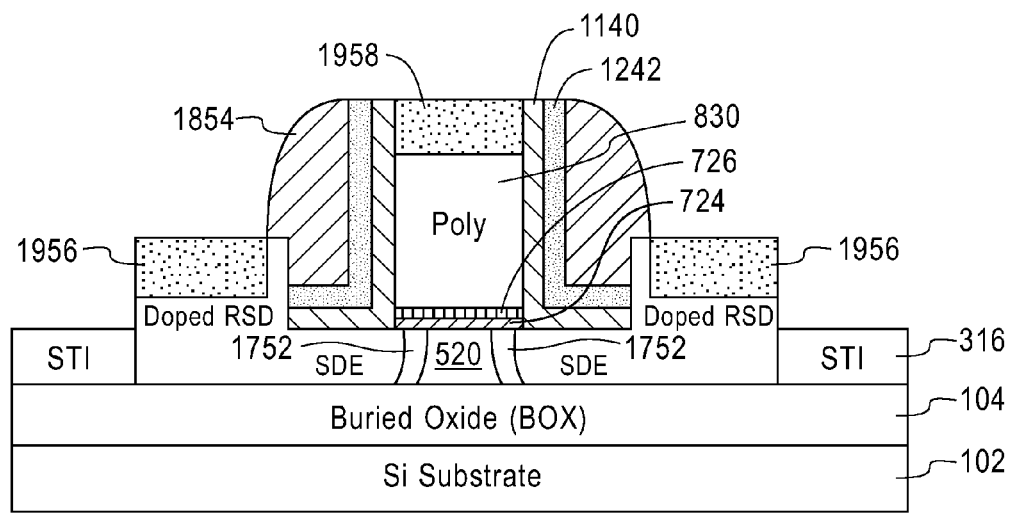
Figure 10:
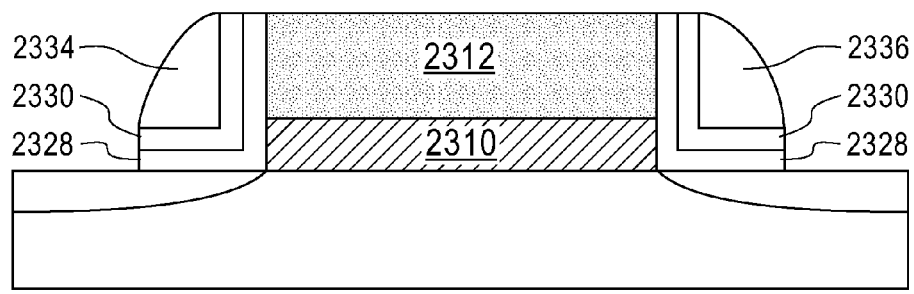
FIG. 10 is a cross-sectional view of a conventional Field Effect Transistor.

Next, suicide areas 1956 and 1958 are formed for contacts using the spacer structure for alignment, as shown in FIG. 9. In this embodiment, this is achieved by removing the oxide (e.g., through a wet etch using HF), depositing a metal, performing an anneal to form silicide, and then selectively removing the metal but leave the silicide untouched (e.g., through an aqua regia wet etch). In this exemplary embodiment, the metal is nickel, cobalt, titanium, or platinum.

The resulting ETSOI transistor structure is shown in FIG. 9. From this point, conventional fabrication processes are used to form the remainder of the integrated circuit that includes this transistor.

Accordingly, the present invention provides a thin spacer structure that enables an ETSOI transistor to integrate a high-K dielectric and metal gate stack and an epitaxial raised source/drain. The structure eliminates underoxide growth beneath the high-K dielectric and prevents silicon loss during spacer formation.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for fabricating an extremely-thin-silicon-on-insulator transistor, the method comprising the steps of:

forming a gate stack on a silicon layer that is above a buried oxide layer, the gate stack including a high-k oxide layer on the silicon layer and a metal gate on the high-k oxide layer;

forming a first nitride layer on the silicon layer and the gate stack;

forming an oxide layer on the first nitride layer;

forming a second nitride layer on the oxide layer;

etching the first nitride layer and the oxide layer so as to form a nitride liner and an oxide liner adjacent to the gate stack, and etching the second nitride layer so as to form a first nitride spacer adjacent to the oxide liner;

epitaxially forming a raised source/drain region adjacent to the nitride liner, the oxide liner, and first nitride spacer; and implanting ions into the raised source/drain region using the first nitride spacer to align the implantation.

2. The method of claim 1, further comprising the steps of:

removing the first nitride spacer;

forming a second spacer adjacent to the oxide liner; and forming a silicide area of the raised source/drain region using the second spacer to align the silicide area.

3. The method of claim 2, wherein the step of forming the second spacer comprises:
   depositing a third nitride layer; and
   etching the third nitride layer.

4. The method of claim 3, wherein the gate stack also includes a polysilicon layer over the metal gate layer, and a silicide layer over the polysilicon layer.

5. The method of claim 1, wherein the gate stack also includes a polysilicon layer over the metal gate layer.

6. The method of claim 5, wherein the gate stack also includes a silicide layer over the polysilicon layer.

7. The method of claim 1, further comprising the step of implanting ions so as to form extension implants in the silicon layer below the gate stack.

* * * * *